(12) United States Patent
Goh

(10) Patent No.: US 6,343,503 B1
(45) Date of Patent: Feb. 5, 2002

(54) MODULE APPEARANCE INSPECTION APPARATUS

(75) Inventor: Seok Goh, Choongchungnam-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/455,302

(22) Filed: Dec. 6, 1999

(30) Foreign Application Priority Data

Dec. 8, 1998 (KR) .............................................. 98-53556

(51) Int. Cl.⁷ ........................ G01B 11/24; G01M 19/00; H01L 21/66
(52) U.S. Cl. ............................. 73/104; 73/866; 73/865.8
(58) Field of Search ......................... 73/104, 105, 866, 73/865.8

(56) References Cited

U.S. PATENT DOCUMENTS

| | | | |
|---|---|---|---|
| 4,750,141 A | * 6/1988 | Judell et al. | 73/865.8 |
| 5,110,428 A | * 5/1992 | Prigge et al. | 204/217 |
| 5,689,063 A | * 11/1997 | Fujiu et al. | 73/105 |
| 5,835,223 A | * 11/1998 | Zwemer et al. | 356/390 |
| 5,850,038 A | * 12/1998 | Ue | 73/105 |

FOREIGN PATENT DOCUMENTS

| | | | | |
|---|---|---|---|---|
| JP | 57-52809 | * | 3/1982 | ................ 73/865.8 |
| JP | 58-2740 | * | 1/1983 | .................. 73/104 |
| JP | 02-21274 | * | 1/1990 | |
| JP | 02-36306 | * | 2/1990 | .................. 73/104 |

* cited by examiner

Primary Examiner—Daniel S. Larkin
(74) Attorney, Agent, or Firm—Skjerven Morrill MacPherson LLP; David W. Heid

(57) ABSTRACT

A module appearance inspection apparatus includes a warpage checking unit, a visual checking unit, a first module transfer unit for unloading the module from a module tray, a second module transfer unit for transferring the module within the apparatus, and a third module transfer unit for loading the module to a module tray. The apparatus can replace the first and third module transfer units with a single module transfer unit. In this case, the apparatus includes: a warpage checking unit; a visual checking unit; a supply unit in which module trays are stacked; a storage unit in which module trays also can be stacked; a tray transfer unit which moves a module tray from the supply unit to the storage unit; a first module transfer unit which unloads and loads the module from and to the module tray on the tray transfer unit; and a second module transfer unit which transfers the module from the warpage checking unit or the visual checking unit.

16 Claims, 15 Drawing Sheets

MODULE APPEARANCE INSPECTION APPARATUS

BACKGROUND OF THE INVENTION

1. Field of the Invention

The present invention relates to a semiconductor device inspection apparatus and more particularly to a module appearance inspection apparatus.

2. Description of the Related Art

Semiconductor devices are often used in a module which includes a printed circuit board and semiconductor devices attached on the printed circuit board. For example, a memory module includes memory integrated circuits on a printed circuit board on which circuit patterns electrically connect the memory integrated circuits to interface terminals on the printed circuit board. The interface terminals are often called 'tabs', and electrically connect the memory module to an external component.

Typically, after assembly, the memory modules undergo a series of electrical tests and an appearance inspection. The electrical tests determine whether the module meets the requirements for electrical operations, and the appearance inspection determines whether the module has any physical defects such as warping of the module.

The module appearance inspection is done manually by visual inspection. Accordingly, the appearance inspection is subject to human errors, low inspection accuracy, and long inspection time.

SUMMARY OF THE INVENTION

The present invention is directed to an apparatus for inspecting the appearance of semiconductor device modules, such as single-inline-memory-modules (SIMMs) and dual-inline-memory-modules (DIMMs). The apparatus includes a warpage checking unit, a visual checking unit, a first module transfer unit for unloading modules from a module tray, a second module transfer unit for transferring modules within the apparatus, and a third module transfer unit for loading modules to another module tray.

Each of the first module transfer unit and the third module transfer unit inicludes a module pickup unit that grips the module and a module pickup moving unit that moves the module pickup unit in X-Y directions. The module pickup unit includes: a vertical cylinder for moving the module pickup unit up and down; a fixed frame; a rotating frame coupled to the fixed frame such that the rotating frame can rotate against the fixed frame; and a module gripper connecting to the rotating frame to bold the module. The module gripper includes: a guide rail; the driving pulley rotated by a space control motor; a passive pulley driven by the driving pulley through a belt which is wound around the driving pulley and the passive pulley; a pair of guide blocks moving along the guide rail and coupled to the belt; and a pair of gripping parts respectively coupled to the guide blocks. The gripping parts move close to each other or away from each other depending on the direction of rotation of the driving pulley so that the gripping parts grip or release the module.

The second module transfer unit includes a module inverting unit and a moving unit for moving the module inverting unit in the X-Y directions. The module inverting unit includes: a first motor driving a vertical shaft of the module inverting unit such that the module inverting unit moves up and down; a second motor that rotates and drives back and forth a horizontal shaft of the module inverting unit; and a module gripping member coupled to the horizontal shaft such that the module gripping member rotates with the horizontal shaft.

The warpage checking unit includes sensors spaced apart from one another and a sensor moving unit for adjusting the distances between the sensors. The sensor moving unit includes: a warpage checking unit body having a slot; a driving pulley rotated by a space control motor; a passive pulley driven by the driving pulley through a belt which is wound around the driving pulley and the passive pulley; and guide blocks moving along the slot and coupled to the belt, wherein the sensors are respectively coupled to the guide blocks. The sensors move close to each other or away from each other depending on the direction of rotation of the driving pulley, so that the sensors can adjust to modules various sizes.

The apparatus can replace the first and third module transfer units with a single module transfer unit. In this case, the apparatus includes: a warpage checking unit; a visual checking unit; a supply unit in which module trays are stacked; a storage unit in which module trays also can be stacked; a tray transfer unit which moves a module tray from the supply unit to the storage unit; a first module transfer unit which unloads and loads the modules from and to the module trays on the tray transfer unit; and a second module transfer unit which transfers the module from the warpage checking unit or the visual checking unit.

Each of the supply unit and the storage unit includes a module tray releasing/receiving unit having a module tray supporting device. The module tray supporting device lifts the module trays to isolate a module tray from the stacked module trays of the supply unit, or for insertion of a module tray into a bottom of the stack in the storage unit. The module tray supporting device includes: a vertical shaft moving up and down when driven by a first cylinder; a module tray supporting rod coupled to the vertical shaft; and a second cylinder driving the module tray supporting rod back and forth, so that the module tray supporting rod moves under or retracts from the stacked module trays.

BRIEF DESCRIPTION OF THE DRAWINGS

The features and advantages of the present invention will become more apparent by describing in detail specific embodiments thereof with reference to the attached drawings in which.

Use of the same reference symbol in different figures indicates similar or identical items.

DETAILED DESCRIPTION OF THE INVENTION

In accordance with an aspect of the present invention, an apparatus automates inspecting of the external appearance of semiconductor device modules, such as single-inline-memory-modules (SIMMs) and dual-inline-memory-modules (DIMMs).

Figure 1:
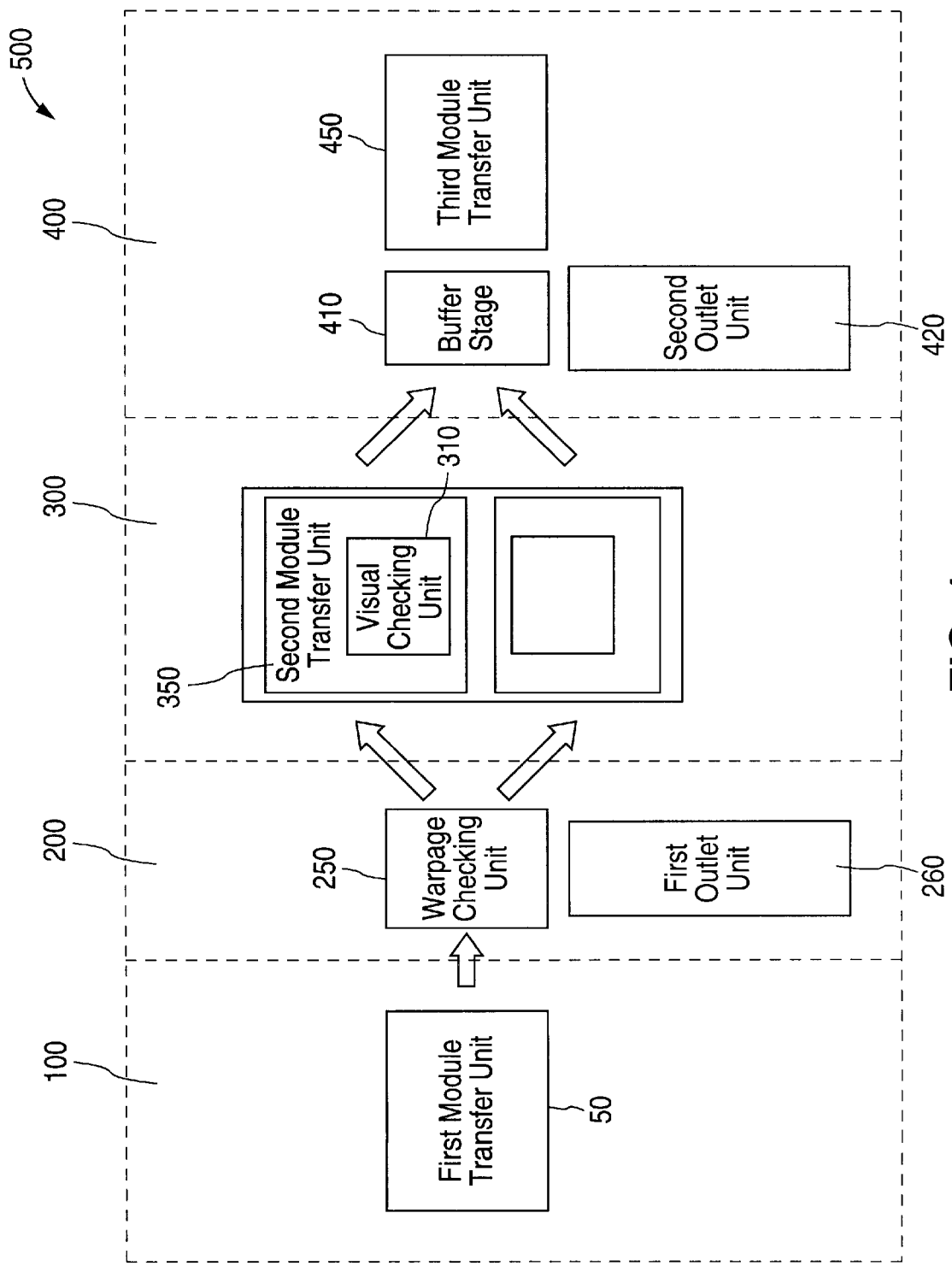
FIG. 1 a plan view of a module appearance inspection apparatus according to an embodiment of the present invention.

FIG. 1 is a plan view of a module appearance inspection apparatus 500 in accordance with an embodiment of the present invention. Apparatus 500 includes a module unloading portion 100 which unloads modules (not shown) from trays, a first inspection portion 200, a second inspection portion 300, and a module loading portion 400.

Module unloading portion 100 includes a first module transfer unit 50. First inspection portion 200 receives modules from module unloading portion 100, and a warpage checking unit 250 inspects whether the modules transferred from module transfer unit 50 are warped or not. After the inspection, a first outlet unit 260 stops the modules that failed the inspection from being transferred to second inspection portion 300. In second inspection portion 300, a second module transfer unit 350 transfers the modules from warpage checking unit 250 to a visual checking unit 310, and visual checking unit 310 inspects the external appearance of the modules. Finally, in module loading portion 400 next to second inspection portion 300, a buffer stage 410 receives the modules that passed the inspections in first and second inspection portions 200 and 300, and a second outlet unit 420 receives the modules that failed the inspection in second inspection portion 300. Then, a third module transfer unit 450 loads the modules from buffer stage 410 to trays (not shown). Known robotics and controlling technologies can implement the operations of apparatus 500.

Figure 2:
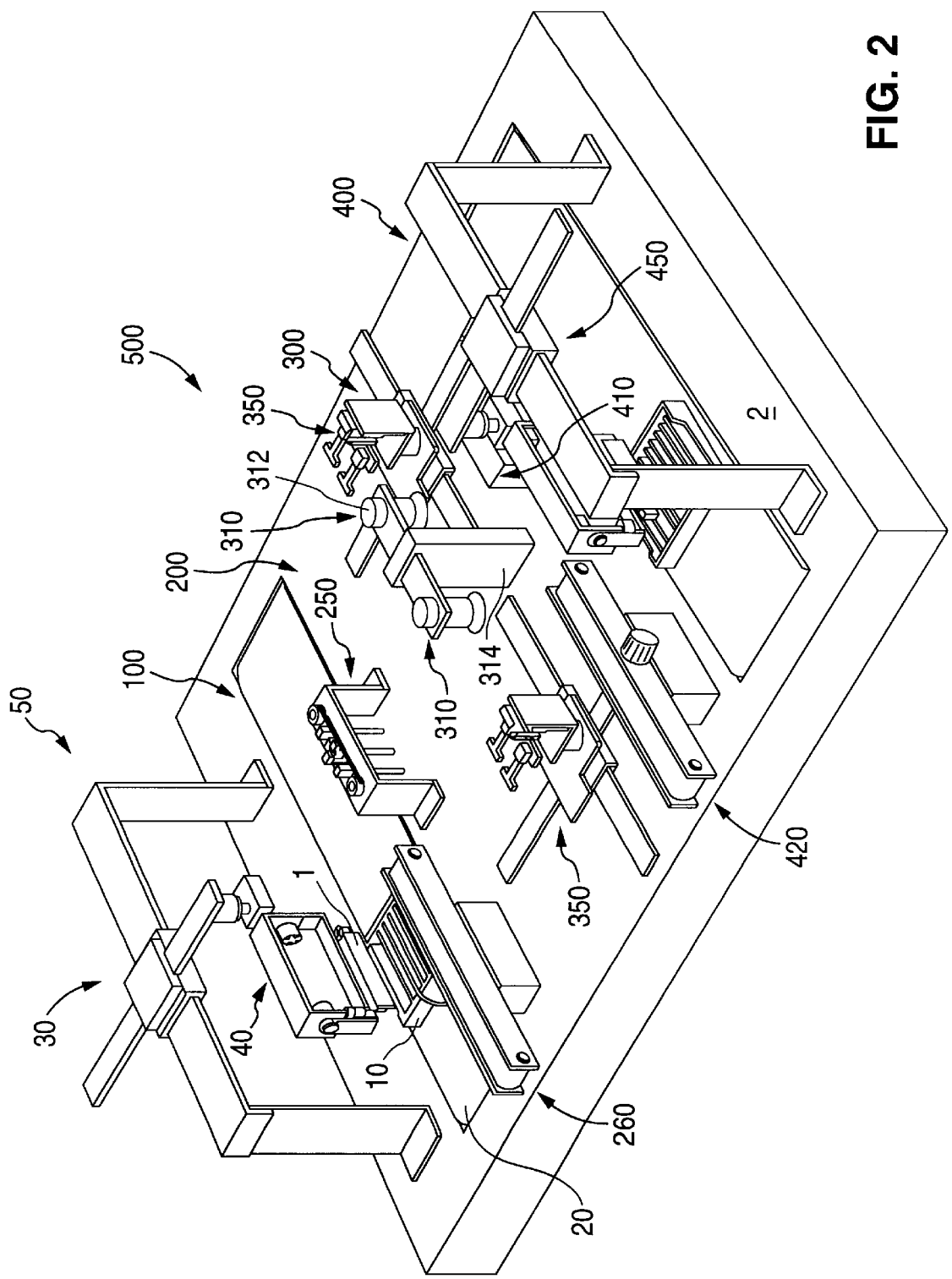
FIG. 2 is a perspective view of the apparatus of FIG. 1.

FIG. 2 is a perspective view of apparatus 500 of FIG. 1. Module unloading portion 100 includes a conveyor belt 20 and first module transfer unit 50. Conveyor belt 20 transports a module tray 10 from module tray storage (not shown) to a position on module unloading portion 100 where a module 1 can be picked up. First module transfer unit 50 picks up module 1 from module tray 10 and transfers module 1 to first inspection portion 200. First module transfer unit 50 uses an XY-transfer unit 30 which moves in the X and Y-axis directions and a module pickup unit 40 for the module pick-up and transfer.

Figure 3:
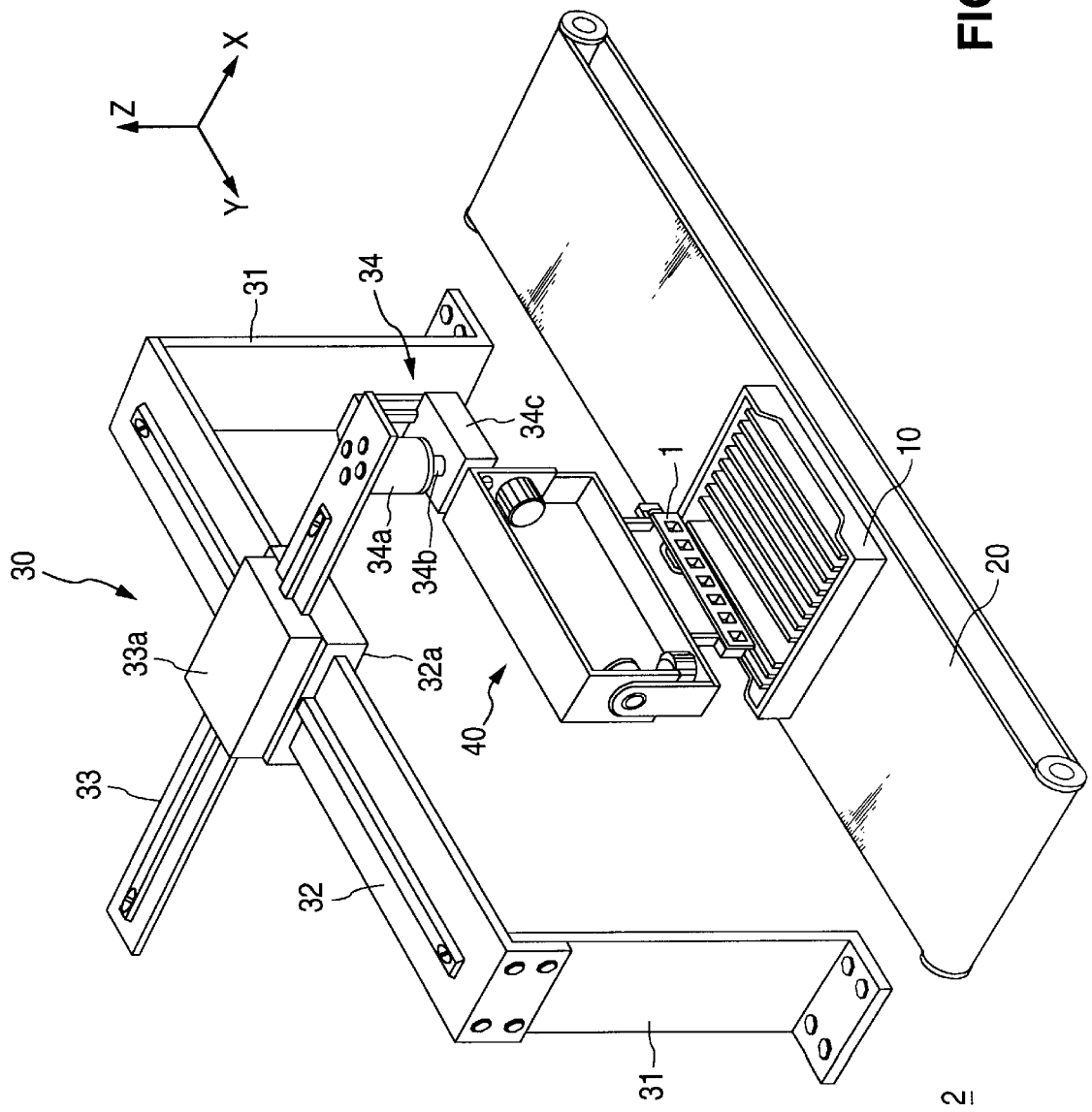
FIG. 3 is a perspective view of an XY transferring unit, a module pickup unit, and a conveyor belt installed in a module unloading portion of the apparatus of FIG. 2.
Figure 4:
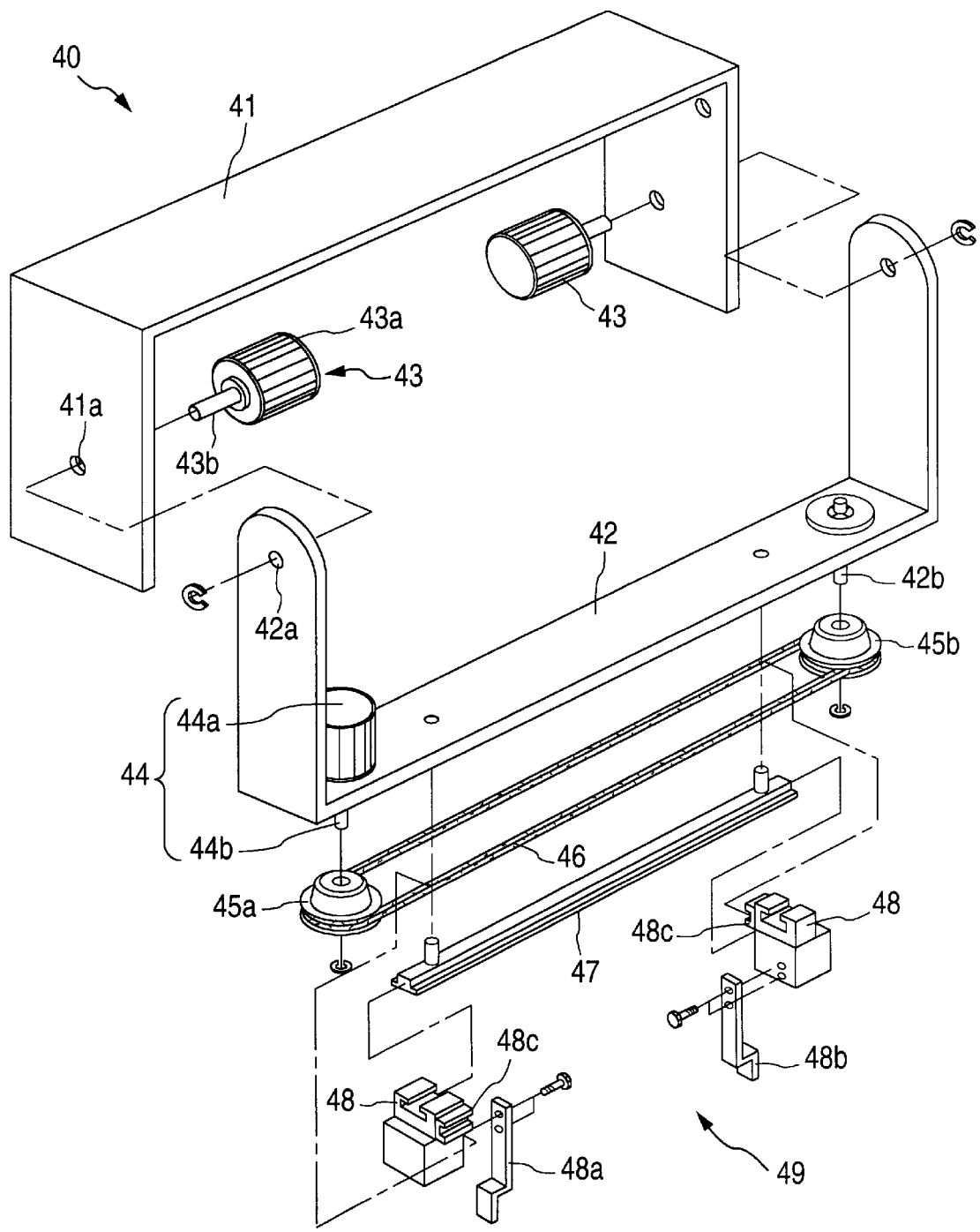
FIG. 4 is an exploded perspective view of the module pickup unit of FIG. 3.
Figure 5:
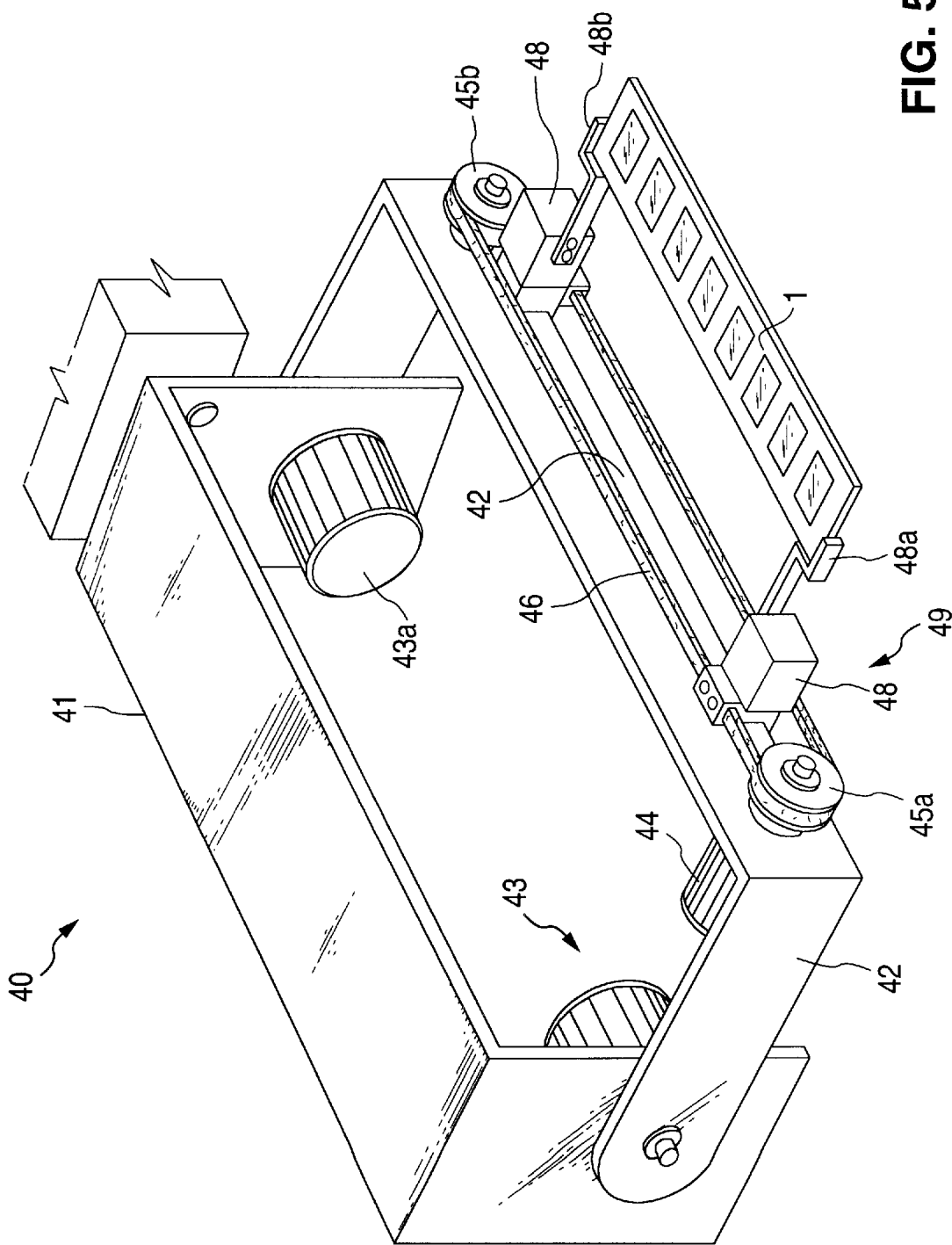
FIG. 5 is an enlarged view of the module pickup unit of FIG. 3, illustrating operation of the module pickup unit.

The operation of XY-transfer unit 30 and module pickup unit 40 can be explained further with reference to FIGS. 3 to 5. XY-transfer unit 30 includes a pair of plates 31 having a predetermined height in Z-axis direction on a supporting plate 2, an Y-axis transfer plate 32 mounted on plates 31, a Y-axis transfer block 32a moving on and along Y-axis transfer plate 32, an X-axis transfer block 33a mounted on Y-axis transfer block 32a, and an X-axis transfer plate 33 mounted underneath X-axis transfer block 33a for movement along the X-axis.

A lifting unit 34 is under an end of X-axis transfer plate 33, and module pickup unit 40 connects to lifting unit 34. Lifting unit 34 includes a Z-axis driving cylinder 34a connected to X-axis transfer plate 33, a pickup unit mounting block 34c connected to module pickup unit 40, and a cylinder rod 34b connecting Z-axis driving cylinder 34a to pickup unit mounting block 34c.

Regarding to FIGS. 3 and 4, module pickup unit 40 includes a fixed frame 41, a rotating frame 42, and a module gripper 49. Both end portions of fixed frame 41 extend in the Z-axis direction and have holes 41a. Both end portions of rotating frame 42 also have holes 42a and are coupled to fixed frame 41 so that rotating frame 42 can rotate relative to fixed frame 41.

Rotating frame 42, when connected to fixed frame 41, has the inner surfaces of both end portions of rotating frame 42 in contact with the outer surfaces of both end portions of fixed frame 41, and holes 41a and 42a are aligned to each other. A servo motor 43 has a rotating shaft 43b, and through holes 41a and 41b, secures fixed frame 41 and rotating frame 42 together. A body 43a of servo motor 43 is permanently fixed to fixed frame 41, for example, by welding, and rotating shaft 43b is permanently fixed to rotating frame 42. Accordingly, when rotating shaft 43b rotates, rotating frame 42 rotates relative to fixed frame 41. Rotating shaft 43b rotates, when a control system (not shown) applies a driving signal to servo motor 43 through a cable (not shown). Module gripper 49 connects to rotating frame 42. Module gripper 49 includes a pair of pulleys 45a and 45b, a tension belt 46, a guide rail 47, a pair of guide blocks 48, and a pair of gripping parts 48a and 48b.

Pulleys 45a and 45b are under rotating frame 42. A rotating shaft 44b of a servo motor 44 inserts into the axis of pulley 45a through a hole in rotating frame 42, and a body 44a of serve motor 44 is mounted on rotating frame 42. Rotating shaft 44b can rotate freely from body 44a. Pulley 45b connects to rotating frame 42 through a fixed shaft 42b, which extends through a hole in rotating frame 42. Tension belt 46 is wound around pulleys 45a and 45b, so that rotating shaft 44b rotates pulley 45a and drives pulley 45b. The control system (not shown) of apparatus 500 drives servo motor 44 through a cable (not shown).

Guide rail 47 is mounted under rotating frame 42 between pulleys 45a and 45b. There guide blocks 48 are assembled to guide rail 47 in such a manner that guide blocks 48 can move along guide rail 47. Gripping parts 48a and 48b couple to guide block 48.

Each of the guide blocks 48 has a belt clip 48c that attaches to tension belt 46. Accordingly, when rotating shaft 44b rotates clockwise, gripping parts 48a and 48b move apart from each other. When rotating shaft 44b rotates counter-clockwise, gripping parts 48a and 48b move toward each other, allowing gripping parts 48a and 48b to grip modules of different sizes.

As described above, the combined operation of module gripper 49 and servo motor 44 grips module 1 in tray 10. Z-axis driving cylinder 34a is responsible for up-and-down movement of module pickup unit 40. That is, before module gripper 49 grips module 1, Z-axis driving cylinder 34a moves module pickup unit 40 down, and after the gripping, Z-axis driving cylinder 34a moves module pickup unit 40 up to pick module 1 up from tray 10.

After the pick-up, servo motors 43 rotate rotating frame 42 as shown in FIG. 5, for later placement of module 1 on a warpage checking unit 250 (FIG. 2) of first inspection portion 200. Then, XY-transfer unit 30 moves module 1 to align module 1 on warpage checking unit 250, and servo motor 44 drives module gripper 49 to release module 1.

Figure 6:
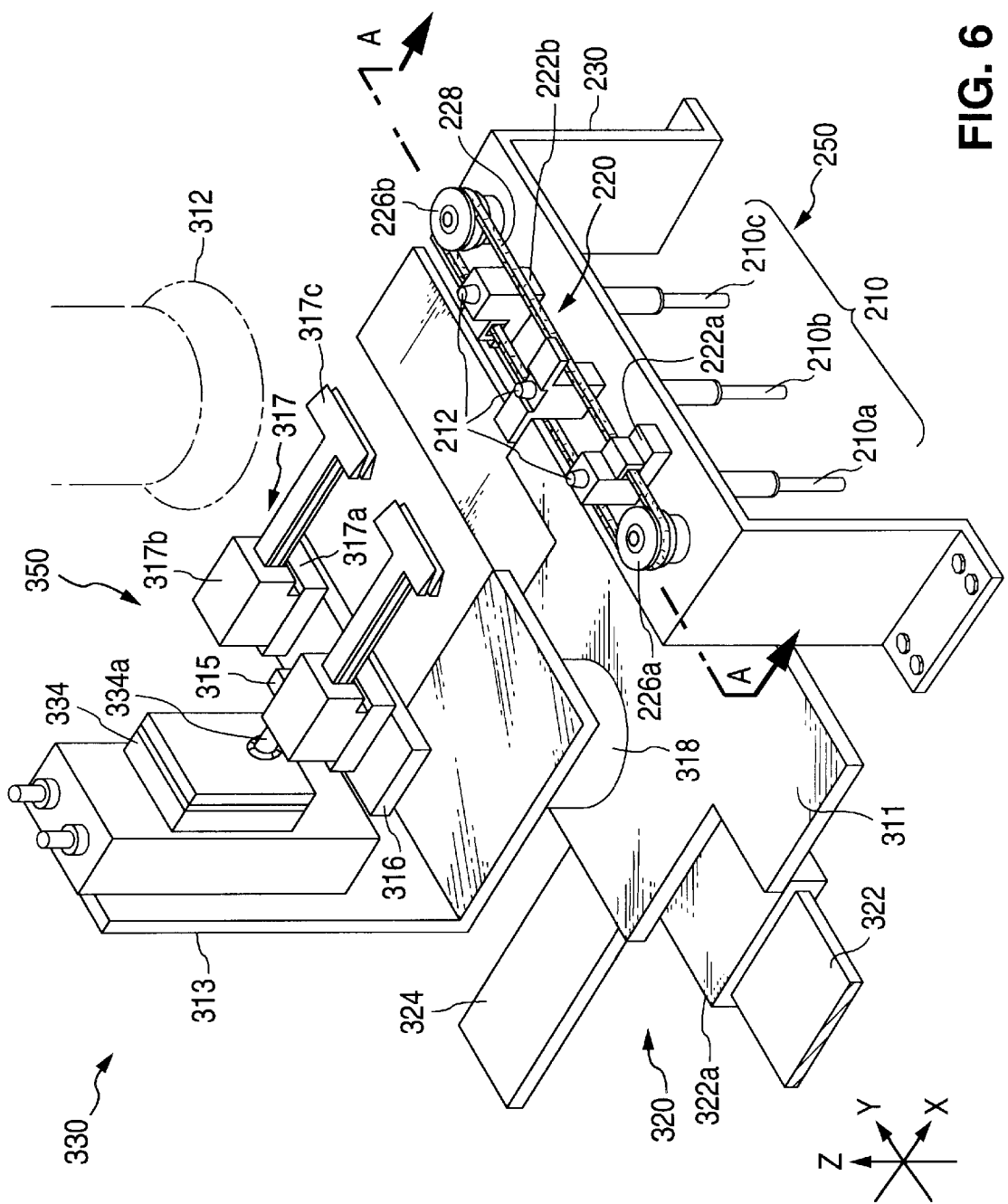
FIG. 6 is a perspective view of a warp check unit and a module inverting portion of the apparatus of FIG. 2.
Figure 7:
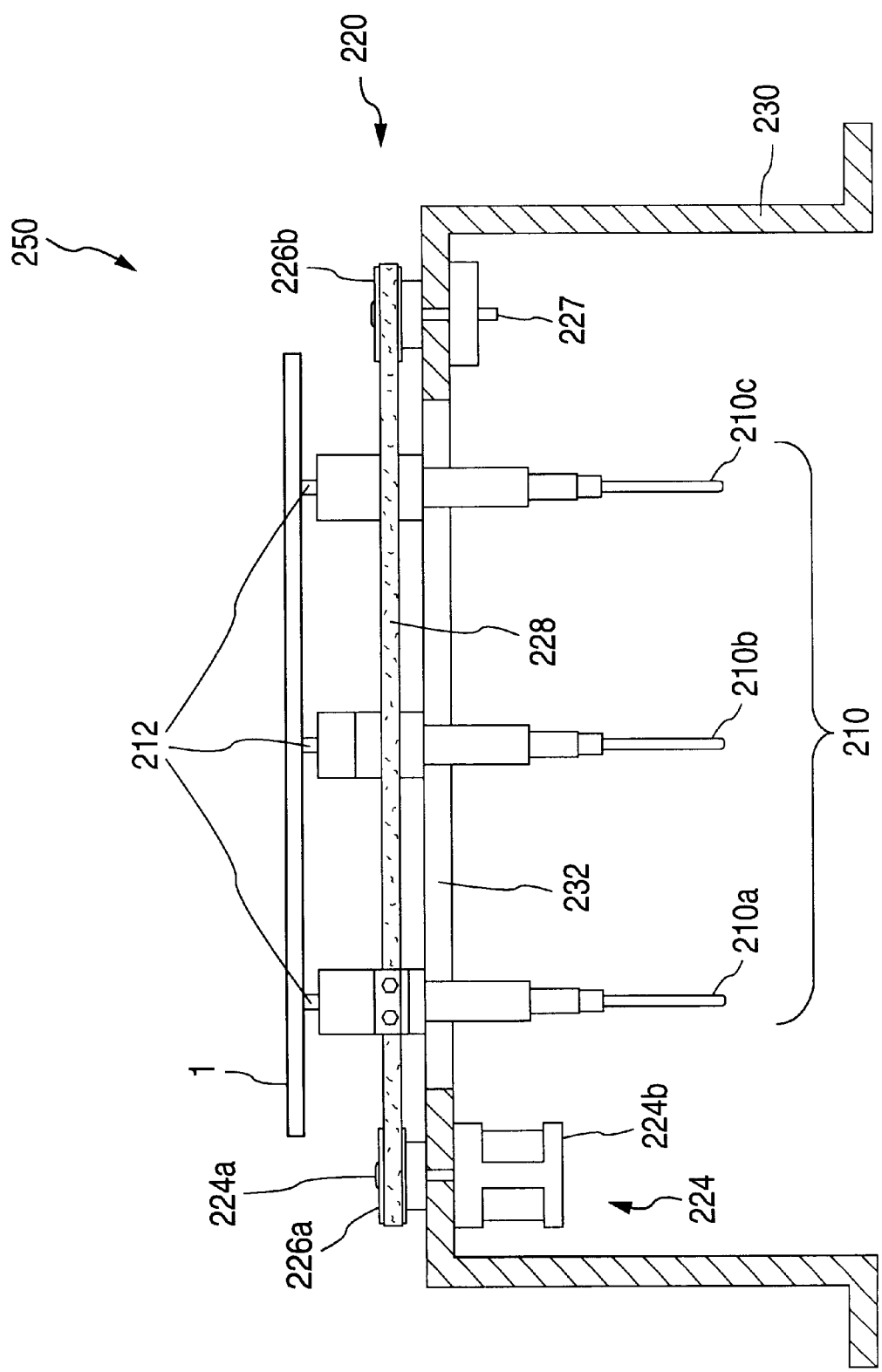
FIG. 7 is a sectional view taken along line A—A of FIG. 6.

FIGS. 6 and 7 illustrate warpage checking unit 250. Warpage checking unit 250 includes sensors 210, each of which has a module sensor protrusion 212 that contacts module 1, a space control unit 220 for controlling the space between sensors 210, and a case 230 for mounting of sensors 210 and space control unit 220. Module sensor protrusions 212 are at the same height level.

When module 1 is on warpage checking unit 250, sensors 210 contact the surface of module 1 to determine whether module 1 is warped. For example, if sensor 210b does not sense module 1 or if sensors 210a and 210c do not sense module 1, module 1 is determined as warped. Springs (not shown) under protrusions 212 let protrusions 212 move a small distance to allow the tolerance of warpage.

If warpage checking unit 250 determines the module 1 is warped, module pickup unit 40 grips module 1, and XY transfer unit 30 transfers the module 1 to first outlet unit 260 (FIG. 2). First outlet unit 260 discharges the module 1 from further inspection.

Space control unit 220 adjusts the distances between sensors 210 according to the size of module 1. Space control unit 220 includes guide blocks 222a and 222b, a step motor 224, pulleys 226a and 226b, and a tension belt 228. Guide blocks 222a and 222b respectively attach to sensors 210a and 210c and drive sensors 210, which are installed within a slit 232 of case 230, to move along slit 232, changing the spacings between sensors 210.

Step motor 224 drives guide blocks 222a and 222b. A rotating shaft 224a of step motor 224 can rotate freely from a body 224b of step motor 224. Rotating shaft 224a is inserted and fixed into the axis of pulley 226a through a hole in case 230, which is close to an end of slit 232, and body 224b is permanently fixed to case 230. Likewise, a shaft 227 is inserted and fixed into the axis of pulley 226b through a hole in case 230, which is close to the other end of slit 232. Shaft 227 can rotate freely. Then, as shown FIG. 6, tension belt 228 is wound around pulleys 226a and 226b and fixed to guide blocks 222a and 222b. Accordingly, depending on the rotational direction of step motor 224, guide blocks 222a and 222b (or sensors 210a and 210c) move closer to or farther from each other.

Regarding FIGS. 2 and 6, after the warpage inspection, second module transfer unit 350 transfers each module 1 that passed the inspection from warpage checking unit 250 to one of visual check units 310 of second inspection portion 300, where the whole external appearance of module 1 is checked. Apparatus 500 has two visual checking units 310 to minimize the standby time of module 1.

Visual checking unit 310 includes a charge-coupled device (CCD) camera 312 and a camera mounting bracket 314 for supporting CCD camera 312. Camera mounting bracket 314 is fixed on supporting plate 2 of apparatus 500.

Second module transfer device 350 transfers module 1 from warpage checking unit 250 to visual checking unit 310. As shown in FIG. 6, second module transfer device 350 includes an inverting unit 330 for inverting module 1 and a transferring device 320 for transferring inverting unit 330 under CCD camera 312.

Transferring device 320 includes a Y-axis transfer plate 322, a Y-axis transfer block 322a moving along Y-axis transfer plate 322, an X-axis transfer plate 324 which is fixed to Y-axis transfer block 322a, and an X-axis transfer block (not shown) moving along X-axis transfer plate 324. Inverting unit 330 includes a mounting plate 311 fixed to the X-axis transfer block, a servo motor 318 fixed on mounting plate 311, a rotating axis (not shown) installed on servo motor 318 in the Z-axis direction, and an L-shaped bracket 313 fixed to the rotating shaft. Servo motor 318 controls the height of inverting unit 330 and drives the rotating axis and L-shaped bracket 313.

Inverting unit 330 further includes another servo motor 334 fixed to L-shaped bracket 313 and a rotating shaft 334a connecting to servo motor 334 along X-axis direction. A chuck 315 couples rotating shaft 334a to an inverting plate 316, such that inverting plate 316 can rotate as rotating shaft 334a rotates. On inverting plate 316, two devices 317 pick up module 1 from warpage checking unit 250. Each device 317 includes a guide rail 317a installed on inverting plate 316, a body 317b moving in X-axis direction along guide rail 317a, and a member 317c installed at an end of body 317b. Member 317c holds module 1. For instance, mechanical clamping or vacuum pickup driven by the control system of apparatus 500 (FIG. 1) can hold module 1. The embodiment of FIG. 6 uses the mechanical clamping.

After holding module 1 from warpage checking unit 250, second module transfer devices 350 transfers module 1 to camera 312 for visual checking. The real image photographed by the CCD camera 312 is compared with a reference image for module 1 and is analyzed. From the comparison and analysis of the two images, the inspecting module is determined to fail or pass the visual checking step. FIGS. 8A to 8F illustrate the visual checking process.

Figure 8A:
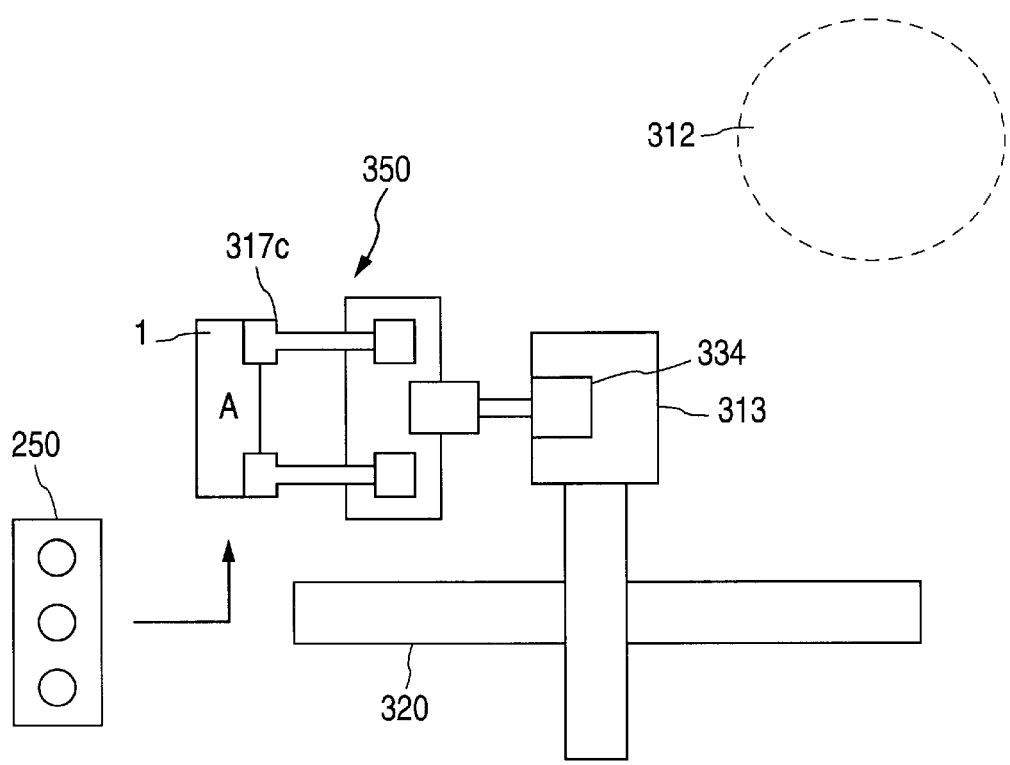
FIGS. 8A to 8F illustrate a visual checking procedure with the apparatus of FIG. 2.
Figure 8B:
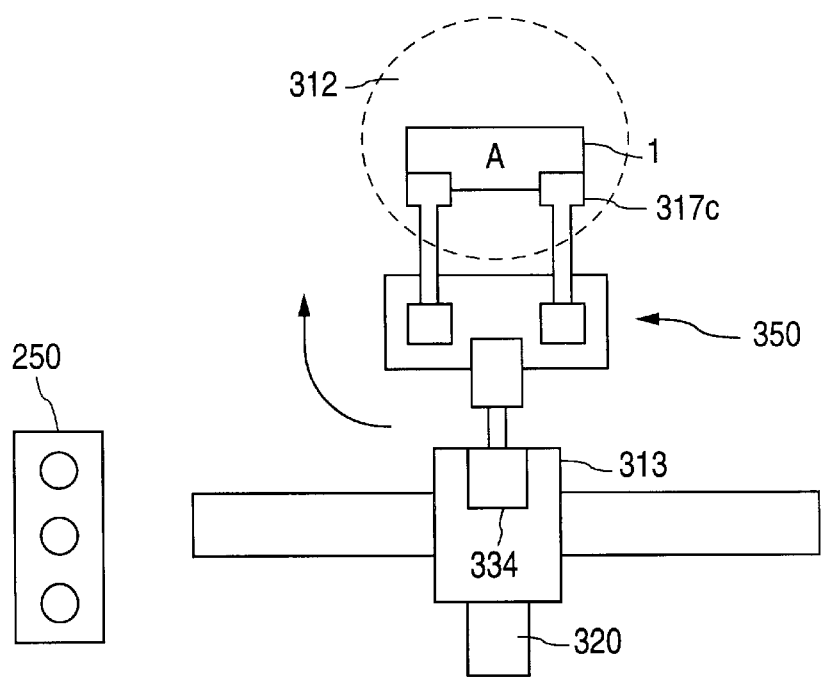
Figure 8C:
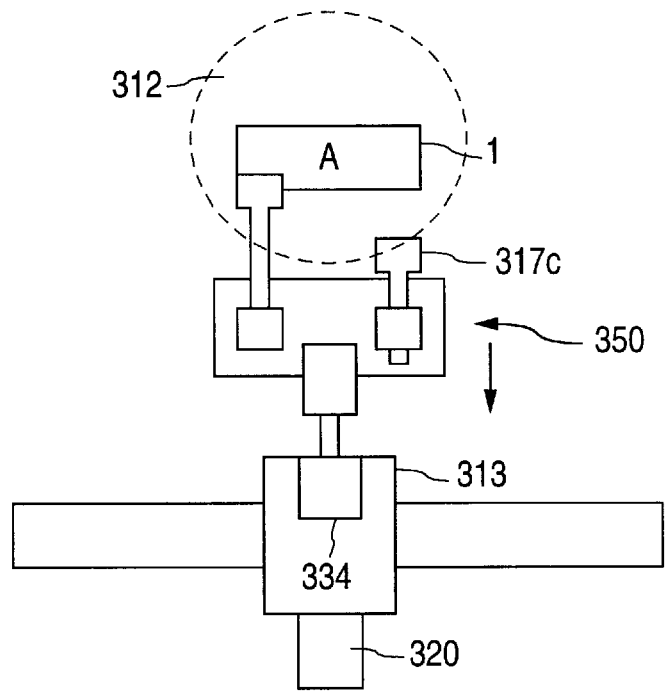
Figure 8D:
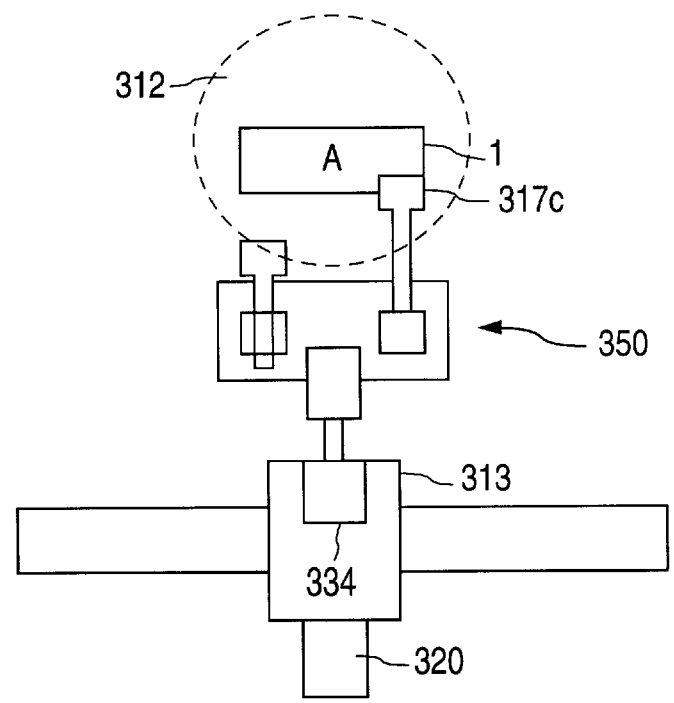

Referring to FIG. 8A, second module transfer devices 350 holds and moves module 1 from warpage checking unit 250. Then, as shown in FIG. 8B, servo motor 318 (FIG. 6) on mounting plate 311 rotates bracket 313, and transferring device 320 moves bracket 313, so that module 1 is placed below CCD camera 312. CCD camera 312 inspects surface A of module 1 and the portions of surface A covered by members 317c by retracting each of members 317c one by one, as shown in FIGS. 8C and 8D.

Figure 8E:
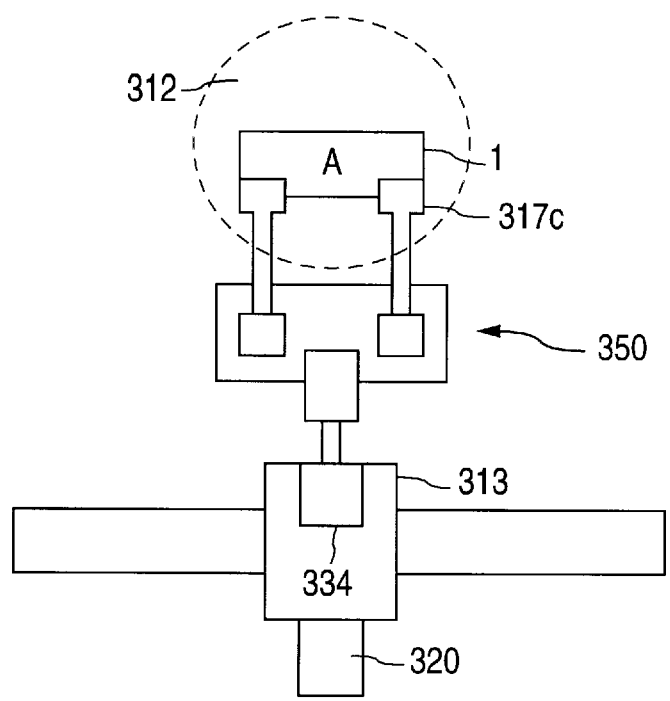
Figure 8F:
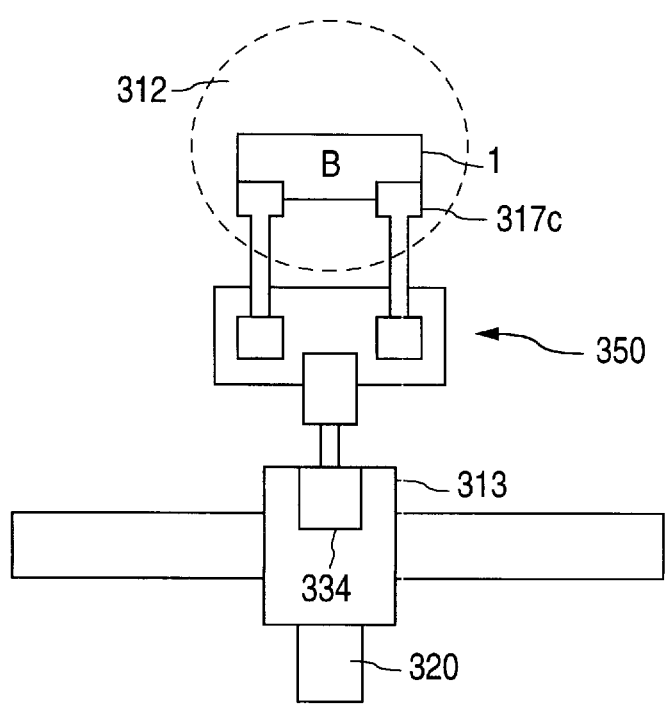

As shown in FIGS. 8E and 8F, after surface A of module 1 is inspected, both members 317c hold module 1 again, and servo motor 334 rotates inverting plates 316 (FIG. 6) by 180 degrees so that camera 312 can inspect the other surface B of module 1. Then, camera inspects surface B in the same way that surface A was inspected.

Returning to FIG. 2, after the visual inspection at second inspection portion 300 is completed as described above, second module transfer unit 350 transfers a module that passed the visual inspection to buffer stage 410 of module loading portion 400. Second module transfer unit 350 moves a module that failed the inspection to second outlet unit 420, which discharges the failed module from apparatus 500. Third module transfer unit 450 completes a whole module appearance inspection cycle of apparatus 500 by transferring the module in buffer stage 410 to a tray (not shown). Here, the structure and operation mechanism of third module transfer unit 450 are substantially identical to that of first module transfer unit 50.

The apparatus described above employs separate module loading and unloading portions. However, another embodiment of the present invention is directed to a module appearance inspection apparatus 950 having a common module loading/unloading portion, as shown in FIGS. 9 to 12.

Figure 9:
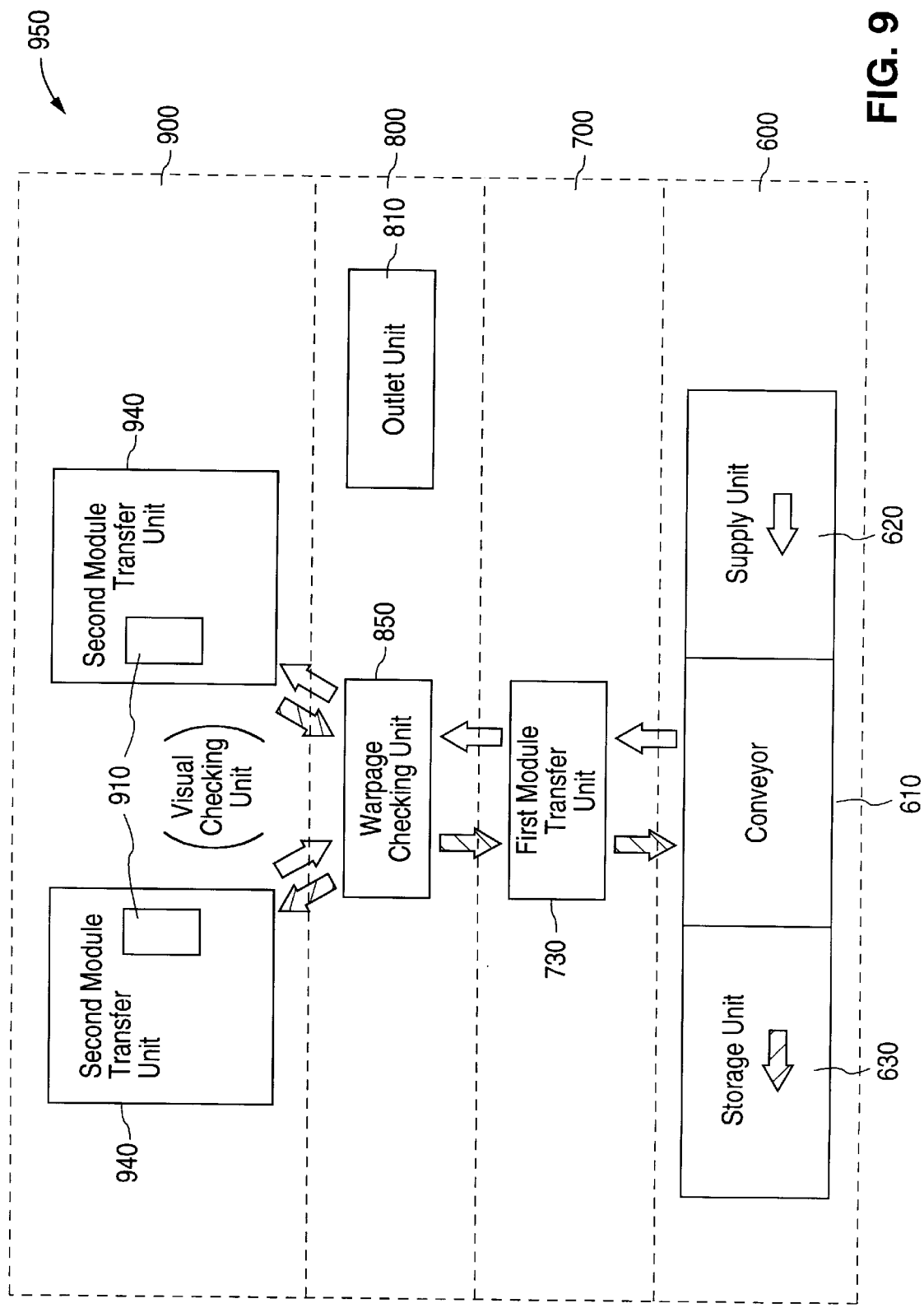
FIG. 9 is a structural diagram of a module appearance inspection apparatus according to another embodiment of the present invention.
Figure 10:
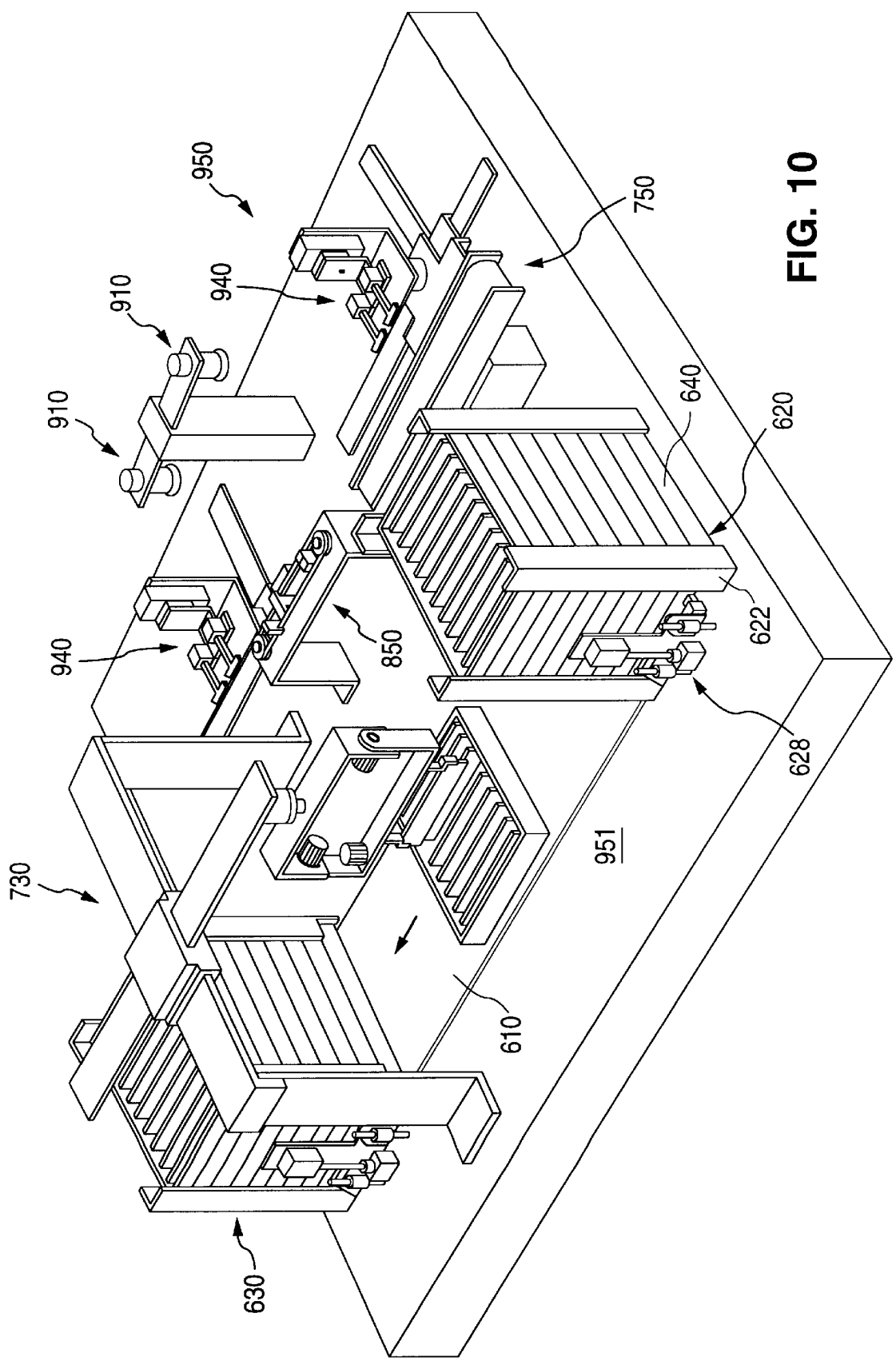
FIG. 10 is a perspective view of the apparatus of FIG. 9.

Referring to FIGS. 9 and 10, module appearance inspection apparatus 950 includes a tray transfer portion 600, a module supply portion 700, a first inspection portion 800, and a second inspection portion 900. Module supply portion 700 includes a first module transfer unit 730 which supplys a module from tray transfer portion 600 to first inspection portion 800, or from second inspection portion 900 to tray transfer portion 600. First inspection portion 800 includes a warpage checking unit 850 and an outlet unit 810. Second inspection portion 900 includes one or more visual checking units 910 and a second module transfer unit 940.

The structure and operation of first module transfer unit 730, warpage checking unit 850, visual checking unit 910, outlet unit 810, and second module transfer unit 940 are basically the same as those of first module transfer unit 50, warpage checking unit 250, visual checking unit 310, first outlet unit 260, and second module transfer unit 350 of apparatus 500 of FIG. 1, respectively. Accordingly, the operation mechanisms are not explained here. As described above, a major difference between apparatus 500 and apparatus 950 is tray transfer portion 600.

Tray transfer portion 600 includes a belt conveyor 610 installed on a supporting plate 951, a supply unit 620 containing module trays 640 for the modules to be inspected in apparatus 950, and an storage unit 630 containing module trays 640 for the modules that were inspected in apparatus 950. Supply unit 620 is at an end of conveyor belt 610, and storage unit 630 is at the other end of conveyor belt 610. Supply unit 620 unloads one of trays 640 stacked in supply unit 620 onto conveyor belt 610, then, first transfer unit 730 picks up a module from the tray on conveyor belt 610, further transferring the module for inspection. After the inspection, first transfer unit 730 loads a module that passed the inspection into the tray on the belt conveyor 610, and then the tray is loaded in storage unit 630.

Figure 11:
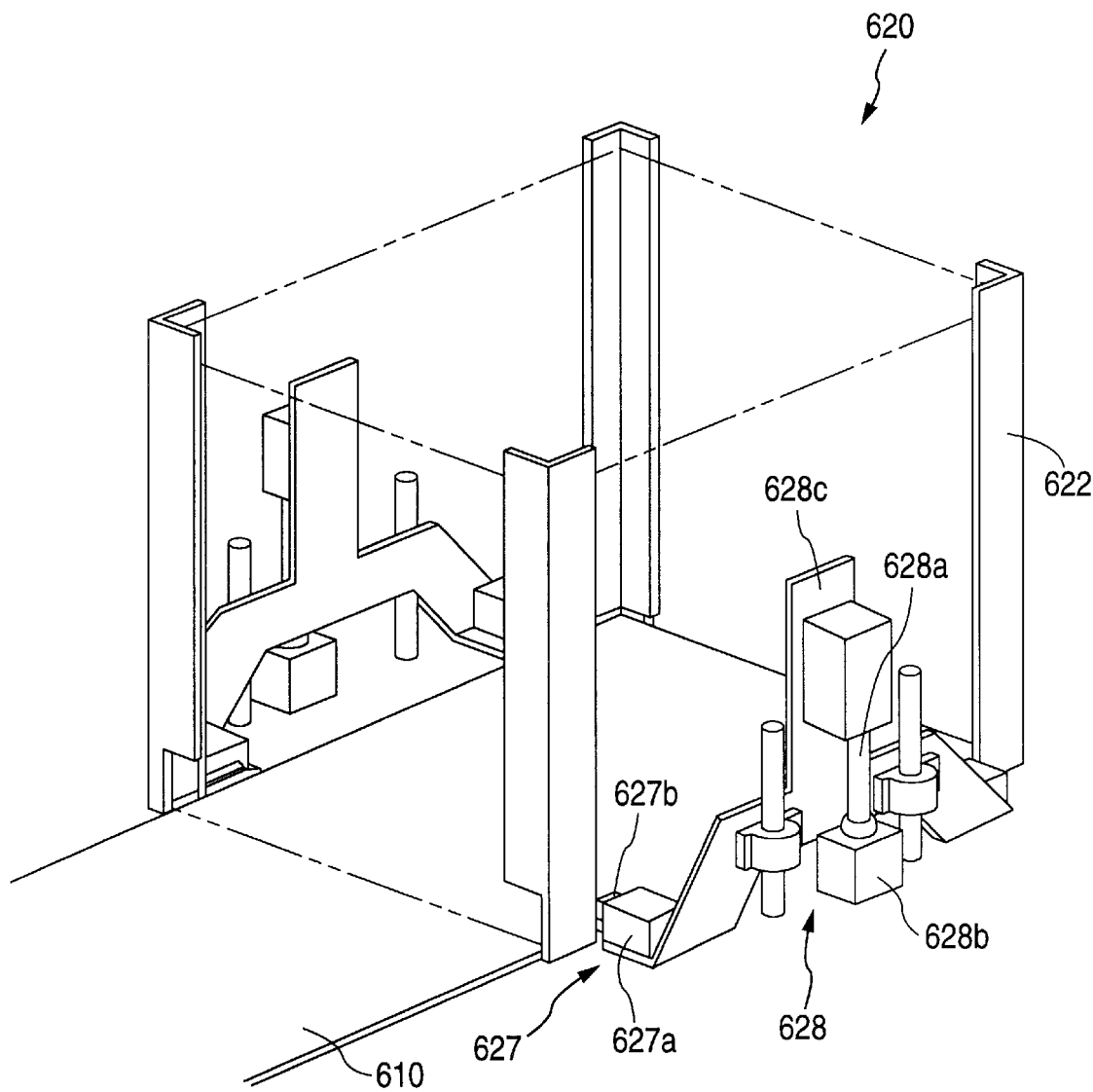
FIG. 11 is a perspective view of first and second loading units of the apparatus of FIG. 10.

Regarding to FIGS. 10 and 11, supply unit 620 includes tray loading poles 622 for supporting module trays 640, a tray isolation cylinder 627, and a pair of tray up-down units 628.

Tray up-down units 628 are between tray loading poles 622 on supporting plate 951, facing each other. Each of tray up-down units 628 includes an up-down unit cylinder 628*b* on supporting plate 951, a cylinder rod 628*a* connecting to up-down unit cylinder 628*b* vertically, and up-down plate 628*c* connecting to cylinder rod 628*a*. Up-down unit cylinder 628*b* drives cylinder rod 628*a* up and down, so that updown plate 628*c* moves up and down. Tray isolation cylinder 627 connects to updown plate 628*c*.

Tray isolation cylinder 627 includes a cylinder body 627*a* and one or more tray supporting rods 627*b*. Cylinder body 627*a* connects to up-down plate 628*c*, and tray supporting rods 627*b* are horizontally disposed to support trays 640. Storage unit 630 has the same architecture as supply unit 620.

FIGS. 12A to 12D illustrate operation of supply unit 620 and storage unit 630.

Figure 12A:
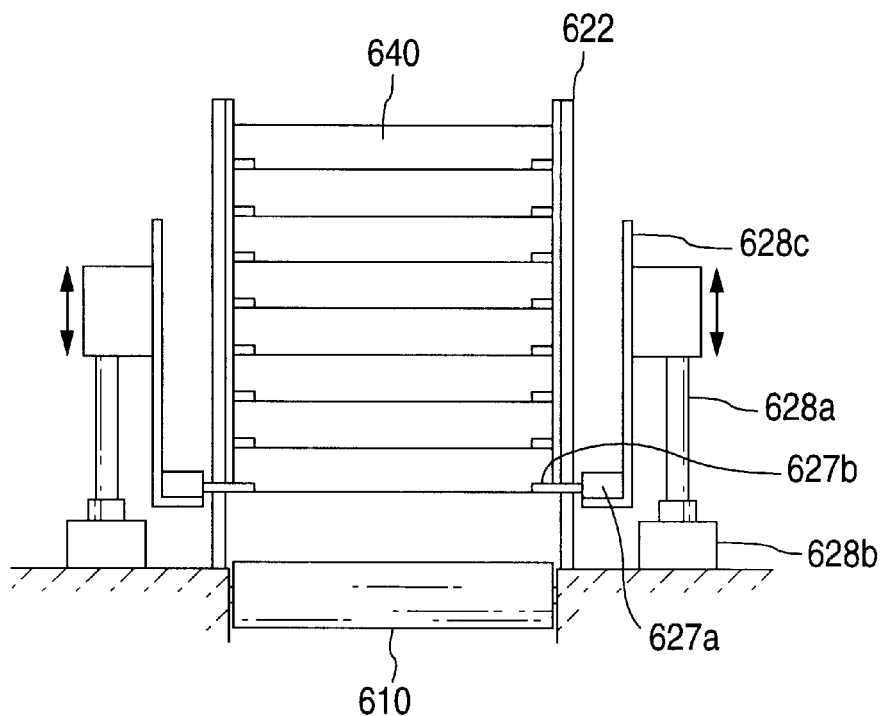
FIGS. 12A to 12D are front views of a tray transfer unit of the apparatus of FIG. 10, illustrating operation of the tray transfer unit.

Regarding FIG. 12A, a tray loading apparatus (not shown) stacks module trays 640 containing modules to be inspected within the boundary of tray loading poles 622 of supply unit 620. Tray supporting rods 627*b* support module trays 640 under the module tray 640 at the bottom of the stack of module trays 640. As module trays 640 are stacked, cylinder rods 628*a* move down, and tray supporting rods 627*b* also move down. When stacking of module trays 640 is finished, the bottom module tray 640 is in contact with belt conveyor 610.

Figure 12B:
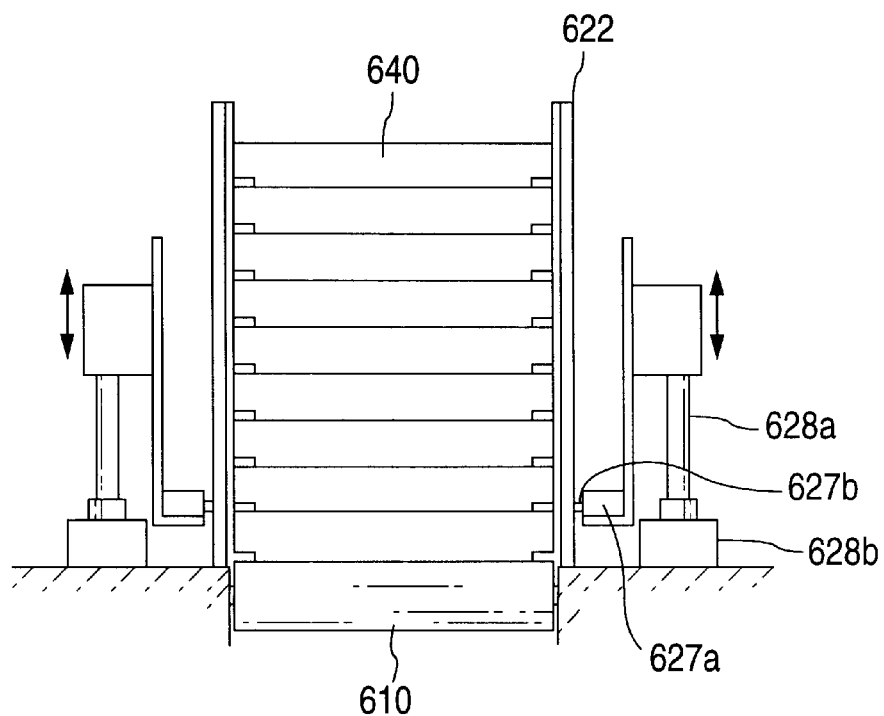
Figure 12C:
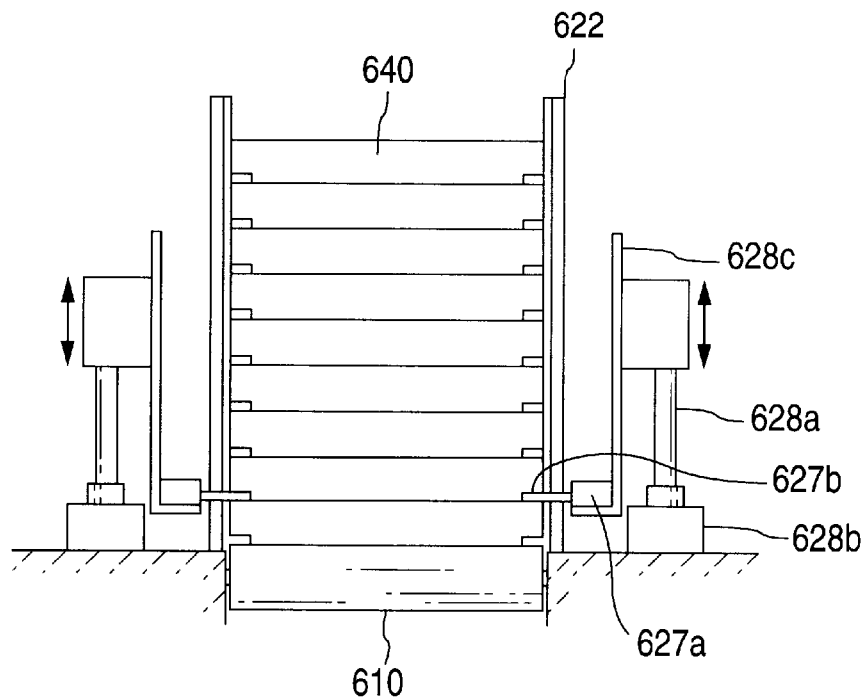
Figure 12D:
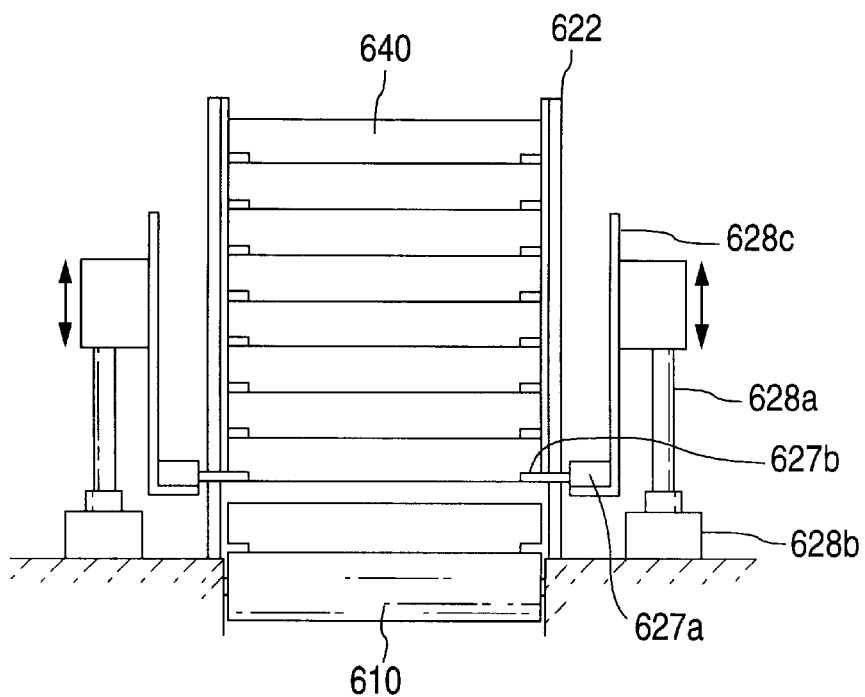

Regarding FIGS. 12B and 12C, tray isolation cylinders 627 retract tray supporting rods 627*b*, and up-down unit cylinder 628*b* drives cylinder rods 628*a* to move up by the distance of a module tray height. Then, tray supporting rods 627*b* extend from cylinder body 627*a* to support stacked module trays 640 again. Finally, as shown in FIG. 12D, up-down unit cylinder 628*b* drives cylinder rods 628*a* to move up, such that conveyor belt 610 can transfer the tray 640 loaded on conveyor belt 610 to the position where first transfer unit 730 picks up a module from the tray 640. After the transfer, cylinder rods 628*a* and tray supporting rods 627*b* move down, so that a bottom module tray 640 contacts conveyor belt 610 again. For the release of this bottom module tray 640, the releasing cycle described above is repeated.

With reference to FIGS. 9 and 10, as described above, belt conveyor 610 transfers module tray 640 as loaded on belt conveyor 610 to a position where first transfer unit 730 can pick up a module from tray 640. Then, first module transfer unit 730 picks up a module from tray 640 and places the module on warpage checking unit 850. After the warpage check, second module transfer unit 940 transfers the module from warpage checking unit 850 to visual checking unit 910, if the module passes the warpage check. If the module fails the warpage check, second module transfer unit 940 transfers the module from warpage checking, unit 850 to outlet unit 810.

After the visual check, first transfer unit 730 transfers the module that passed the visual check to module tray 640 on belt conveyor 610 and the module that failed the visual check to outlet unit 810. Then, belt conveyor 610 transfers module tray 640 as loaded on conveyor belt 610 to storage unit 630. When module tray 640 comes to storage unit 630 which has the same structure as supply unit 620, tray supporting rods of storage unit 630 move up so that module tray 640 is loaded to storage unit 630. After module tray 640 is loaded, the tray supporting rods move down and support the module tray 640 just loaded.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. An apparatus for inspecting a module, comprising:
   a warpage checking unit which checks whether the module is warped or not by contacting a plurality of points on the module; and
   a visual checking unit which performs visual checking of both surfaces of the module.

2. The apparatus according to claim 1, further comprising:
   a first module transfer unit which unloads the module from a first module tray;
   a second module transfer unit which transfers the module from the warpage checking unit or the visual checking unit; and
   a third module transfer unit which loads the module to a second module tray.

3. The apparatus according to claim 2, wherein each of the first module transfer unit and the third module transfer unit comprises:
   a module pickup unit for gripping the module; and
   a moving unit for moving the module pickup unit in an X-Y direction.

4. The apparatus according to claim 3, wherein the module pickup unit comprises:
   a vertical cylinder connecting to the module pickup moving unit, the vertical cylinder moving the module pickup unit up and down;
   a fixed frame;
   a fixed block connecting the fixed frame to the vertical cylinder;

a rotating frame coupled to the fixed frame and driven by a motor such that the rotating frame can rotate relative to the fixed frame; and a module gripper connecting to the rotating frame, the module gripper for gripping the module.

5. The apparatus according to claim 4, wherein the module gripper comprises:

a guide rail;

a control motor fixed to the rotating frame;

a driving pulley installed close to an end of the guide rail, the driving pulley rotated by the control motor;

a passive pulley installed close to another end of the guide rail and driven by the driving pulley through a belt which is wound around the driving pulley and the passive pulley;

a pair of guide blocks moving along the guide rail and coupled to the belt; and a pair of gripping parts respectively coupled to the guide blocks, wherein the gripping parts move close to each other or away from each other depending on a direction of rotation of the driving pulley, so that the gripping parts grip or release the module.

6. The apparatus according to claim 2, wherein the second module transfer unit comprises:

a module inverting unit for inverting the module; and a moving unit for moving the module inverting unit in an X-Y direction.

7. The apparatus according to claim 6, wherein the module inverting unit comprises:

a first motor driving a vertical shaft of the module inverting unit, such that the module inverting unit moves up and down;

a bracket connecting to the vertical shaft;

a second motor connecting to the bracket, the second motor rotating a horizontal shaft of the module inverting unit; and a module gripping member coupled to the horizontal shaft, such that the module gripping member rotates in accordance with the horizontal shaft.

8. The apparatus according to claim 7, wherein the module gripping member holds the module by vacuum suction force.

9. The apparatus according to claim 1, wherein the warpage checking unit comprises a plurality of sensors spaced apart from each other, wherein the module is placed on the sensors for the warpage checking.

10. The apparatus according to claim 9, wherein the warpage checking unit further comprises a sensor moving unit for adjusting distances between the sensors, the sensor moving unit comprising:

a body having a slot along which the sensors move;

a guide rail;

a driving pulley installed close to an end of the guide rail, the driving pulley rotated by a control motor;

a passive pulley installed close to another end of the guide rail and driven by the driving pulley through a belt which is wound to the driving pulley and the passive pulley; and a plurality of guide blocks moving along the slot and coupled to the belt, wherein the sensors are respectively coupled to the guide blocks, wherein the sensors move close to each other or away from each other depending on a direction of rotation of the driving pulley, so that locations of the sensors can adjust to various sizes of the module.

11. The apparatus according to claim 1, wherein the visual checking unit comprises:

a charge coupled device (CCD) camera for performing a visual check; and a camera frame for supporting said CCD camera.

12. The apparatus according to claim 1, further comprising a first outlet unit for discharging the module when the module is determined as warped.

13. The apparatus according to claim 1, further comprising a second outlet unit for discharging the module when the module fails at the visual checking unit.

14. The apparatus according to claim 1, further comprising:

a supply unit in which a plurality of module trays containing a plurality of modules to be inspected can be stacked;

a storage unit in which a plurality of module trays containing a plurality of modules that passed the inspection can be stacked;

a tray transfer unit on which a module tray is released from the supply unit and moves to the storage unit;

a first module transfer unit which unloads and loads the module from and to the module tray on the tray transfer unit; and a second module transfer unit which transfers the module from the warpage checking unit or the visual checking unit.

15. The apparatus according to claim 14, wherein each of the supply unit and the storage unit includes a module tray releasing/receiving unit having a module tray supporting device, wherein the module tray supporting device lifts module trays such that a bottom module tray is isolated from an overlying module tray of the supply unit, or a space is provided for a module tray to be inserted below the stacked module trays of the storage unit.

16. The apparatus according to claim 15, wherein the module tray supporting device comprises:

a vertical shaft moving up and down driven by a first cylinder;

a module tray supporting rod coupled to the vertical shaft; and a second cylinder driving the module tray supporting rod back and forth, so that the module tray supporting rod moves under or retracts from the stacked module trays.

* * * * *